(12) United States Patent
Yoshimura et al.

(10) Patent No.: US 8,039,364 B2
(45) Date of Patent: Oct. 18, 2011

(54) MANUFACTURING METHOD OF SEMICONDUCTOR DEVICE

(75) Inventors: Atsushi Yoshimura, Yokosuka (JP);
Tadanobu Okubo, Yokkaichi (JP);
Shigetaka Onishi, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/662,591

(22) Filed: Apr. 23, 2010

(65) Prior Publication Data
US 2010/0207252 A1   Aug. 19, 2010

Related U.S. Application Data

(62) Division of application No. 11/715,961, filed on Mar. 9, 2007, now Pat. No. 7,736,999.

(30) Foreign Application Priority Data

Mar. 16, 2006   (JP) ................................. P2006-073141

(51) Int. Cl.
*H01L 21/00* (2006.01)

(52) U.S. Cl. ............... 438/460; 438/106; 257/E21.237; 257/E21.599; 257/E23.04

(58) Field of Classification Search .................. 438/106, 438/464; 257/620, E21.599, E23.002; 428/45, 428/352, 354
See application file for complete search history.

(56) References Cited

U.S. PATENT DOCUMENTS

| | | | |
|---|---|---|---|
| 5,266,528 A | 11/1993 | Yamada | |
| 6,545,365 B2 | 4/2003 | Kondo et al. | |
| 7,736,999 B2 * | 6/2010 | Yoshimura et al. | 438/460 |
| 2002/0160185 A1 * | 10/2002 | Nagai et al. | 428/354 |
| 2003/0071539 A1 * | 4/2003 | Kuratani et al. | 310/313 R |
| 2004/0213973 A1 * | 10/2004 | Hara et al. | 428/212 |
| 2004/0245652 A1 | 12/2004 | Ogata | |
| 2005/0062135 A1 | 3/2005 | Tase et al. | |
| 2005/0205981 A1 | 9/2005 | Yoshimura et al. | |
| 2005/0255278 A1 * | 11/2005 | Matsuura et al. | 428/45 |
| 2006/0139893 A1 | 6/2006 | Yoshimura et al. | |
| 2006/0226520 A1 | 10/2006 | Yoshimura et al. | |
| 2008/0197470 A1 | 8/2008 | Yoshimura et al. | |
| 2008/0261039 A1 * | 10/2008 | Tanaka et al. | 428/352 |

FOREIGN PATENT DOCUMENTS

| | | |
|---|---|---|
| CN | 1700467 A | 11/2005 |
| JP | 5-74932 | 3/1993 |
| JP | 2001-308262 | 11/2001 |
| JP | 2003-158096 | 5/2003 |
| JP | 2004-72009 | 3/2004 |

* cited by examiner

*Primary Examiner* — Charles Garber
*Assistant Examiner* — Abdulfattah Mustapha
(74) *Attorney, Agent, or Firm* — Finnegan, Henderson, Farabow, Garrett & Dunner, L.L.P.

(57) ABSTRACT

An adhesive layer of which thickness is over 25 μm and a dicing tape are laminated on a rear surface of a semiconductor wafer. The semiconductor wafer is cut together with a part of the adhesive layer by using a first blade of which cutting depth reaches the adhesive layer. The adhesive layer is cut together with a part of the dicing tape by using a second blade of which cutting depth reaches the dicing tape and of which width is narrower than the first blade. A semiconductor element sectioned by cutting the semiconductor wafer with the adhesive layer is picked up from the dicing tape, and is adhered on another semiconductor element or a circuit board.

11 Claims, 4 Drawing Sheets

MANUFACTURING METHOD OF SEMICONDUCTOR DEVICE

CROSS-REFERENCE TO THE RELATED APPLICATIONS

This is a division of application Ser. No. 11/715,961, filed Mar. 9, 2007, now U.S. Pat. No. 7,736,999 which is incorporated herein by reference.

This application is based upon and claims the benefit of priority from the prior Japanese Patent Application No. 2006-073141, filed on Mar. 16, 2006; the entire contents of which are incorporated herein by reference.

BACKGROUND OF THE INVENTION

1. Field of the Invention

The present invention relates to a manufacturing method of a semiconductor device.

2. Description of the Related Art

In order to realize miniaturization, high density mounting, and so on of a semiconductor device, a stacked multi-chip package in which plural semiconductor elements are stacked and sealed inside of one package is in practical use. In the stacked multi-chip package, the plural semiconductor elements are sequentially stacked via adhesive layers on a wiring substrate. Electrode pads of respective semiconductor elements are electrically connected to an electrode part of the wiring substrate via bonding wires. A multi-layered body as stated above is packaged by a sealing resin, and thereby, the stacked multi-chip package is constituted.

In the stacked multi-chip package, when the same shaped semiconductor elements with each other are stacked or the semiconductor element larger than that of the lower side is stacked at the upper side, there is a possibility that the bonding wire of the lower semiconductor element and the upper semiconductor element may be in contact. Accordingly, it becomes important to prevent occurrences of insulation failure and a short circuit caused by the contact of the bonding wire. Consequently, the following action is taken in which a thickness of the adhesive layer adhering between the semiconductor elements is made to be thick such as 50 μm to 150 μm, and the bonding wire of the lower semiconductor element is taken in the adhesive layer to thereby prevent the contact of the bonding wire with the upper semiconductor element (refer to Japanese Patent Laid-open Application No. JP-A 2001-308262 (KOKAI), Japanese Patent Laid-open Application No. JP-A 2004-072009 (KOKAI)).

A semiconductor wafer is cut in accordance with an element region after an adhesive film and a dicing tape are sequentially laminated on a rear surface of the semiconductor wafer, in order to prepare the sectioned upper semiconductor element. The sectioned semiconductor element is picked up from the dicing tape, and adhered on the lower semiconductor element by using the adhesive film on the rear surface. When a thin semiconductor wafer of which thickness is 85 μm or less is diced, a step cut is applied to suppress a chipping of the semiconductor element (refer to Japanese Patent Laid-open Application No. JP-A 5-074932 (KOKAI)). The step cut is performed by cutting to the dicing tape by a second axis dicing blade after the semiconductor wafer is cut into the middle by a first axis dicing blade.

When an adhesive film having a normal thickness of 10 μm to 25 μm is used, the adhesive film may not have a bad effect on the cut of the semiconductor wafer. However, when a thick adhesive film provided with a spacer function is applied, problems may occur such that the adhesive films is bonded caused by the deformation of adhesive at the time of cutting, the mixture of cut scraps, and cutting heat (approximately 80° C.). This may cause pick up failure of the semiconductor element. Concretely speaking, the adhesive films are bonded to thereby generate breaks and cracks on the semiconductor element at the time of the pick up, or element failure may occur because several pieces of semiconductor elements are picked up continuously.

SUMMARY OF THE INVENTION

A manufacturing method of a stacked-type semiconductor device according to an aspect of the present invention includus: sequentially laminating an adhesive layer of which thickness is over 25 μm and a dicing tape on a rear surface of a semiconductor wafer having plural element regions; cutting the semiconductor wafer in accordance with the plural element regions together with a part of the adhesive layer by using a first blade of which cutting depth reaches the adhesive layer; cutting the adhesive layer together with a part of the dicing tape by using a second blade of which cutting depth reaches the dicing tape and having a narrower width than the first blade; picking up a semiconductor element sectioned by cutting the semiconductor wafer with the adhesive layer, from the dicing tape; and adhering the picked up semiconductor element on a device constructing base via the adhesive layer laminated on a rear surface of the semiconductor element.

A manufacturing method of a stacked-type semiconductor device according to another aspect of the present invention includus: sequentially laminating an adhesive layer of which thickness is over 25 μm and a dicing tape on a rear surface of a semiconductor wafer having plural element regions; cutting a part of the semiconductor wafer in accordance with the plural element regions by using a first blade of which cutting depth is within the semiconductor wafer; cutting the semiconductor wafer together with a part of the adhesive layer by using a second blade of which cutting depth reaches the adhesive layer and having a narrower width than the first blade; cutting the adhesive layer together with a part of the dicing tape by using a third blade of which cutting depth reaches the dicing tape and having a narrower width than the second blade; picking up a semiconductor element sectioned by cutting the semiconductor wafer with the adhesive layer, from the dicing tape; and adhering the picked up semiconductor element on a device constructing base via the adhesive layer laminated on a rear surface of the semiconductor element.

DETAILED DESCRIPTION OF THE INVENTION

Figure 1:
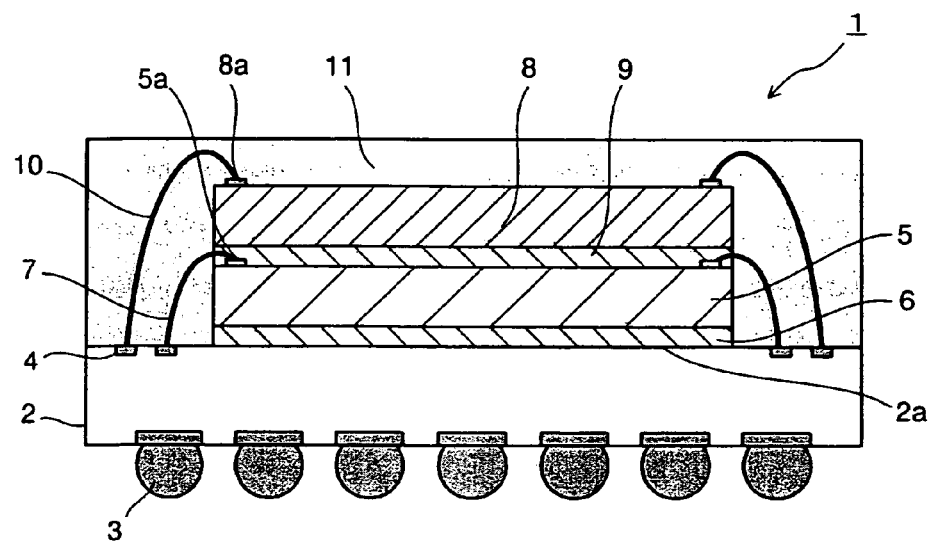
FIG. 1 is a sectional view showing a configuration of a semiconductor device prepared by a manufacturing method of an embodiment.

Hereinafter, embodiments to implement the present invention are described with reference to the drawings. FIG. 1 is a sectional view showing a configuration of a stacked-type semiconductor device of a stacked multichip structure prepared by applying a manufacturing method according to an embodiment of the present invention. A stacked-type semiconductor device 1 shown in the drawing has a circuit board 2 for mounting element. The circuit board 2 is good enough if it has a mounting portion of semiconductor elements and a circuit portion. As the circuit board 2, a wiring substrate in which a wiring network is formed as the circuit portion on a surface or inside of an insulating substrate, a semiconductor substrate, and so on, or a lead frame in which the element mounting portion and the circuit portion are integrated, can be used.

The stacked-type semiconductor device 1 shown in FIG. 1 has a wiring substrate 2 as the circuit board for mounting element. A substrate composed of various materials such as a resin substrate, a ceramics substrate, an insulating substrate such as a glass substrate, or a semiconductor substrate, can be applied as the substrate constituting the wiring substrate 2. As the wiring substrate 2 applying the resin substrate, a general multilayer copper clad laminated board (multilayer printed circuit board) and so on can be cited. External connection terminals 3 such as solder bumps are provided at a lower surface of the wiring substrate 2.

An element mounting portion 2a is provided at an upper surface of the wiring substrate 2. Connection pads 4 electrically connected to the external connection terminals 3 via the wiring network (not shown) are provided at around the element mounting portion 2a. The connection pad 4 functions as a connection part, and to be a wire bonding portion. A first semiconductor element 5 is adhered on the element mounting portion 2a of the wiring substrate 2 via a first adhesive layer 6. A general die attach material is used for the first adhesive layer 6. First electrode pads (electrode part) 5a provided at an upper surface side of the first semiconductor element 5 are electrically connected to the connection pads 4 of the wiring substrate 2 via first bonding wires 7.

A second semiconductor element 8 is adhered on the first semiconductor element 5 via a second adhesive layer 9. The second semiconductor element 8 has a shape, for example, approximately the same or larger compared to the first semiconductor element 5. At least a part of the second adhesive layer 9 is softened or melted by heat temperature at the time of adhering (adhesive temperature) of the second semiconductor element 8, and it is to adhere the first semiconductor element 5 and the second semiconductor element 8 while taking a end portion connected to the first semiconductor element 5 of the first bonding wire 7 (element side end portion of the first bonding wire 7) with inside thereof.

The element side end portions of the first bonding wires 7 are embedded inside of the second adhesive layer 9. In the stacked-type semiconductor device 1 shown in FIG. 1, the first bonding wires 7 are apart away from a lower surface of the second semiconductor element 8 based on a thickness of the second adhesive layer 9. Accordingly, occurrences of insulation failure and a short circuit caused by a contact between the first bonding wire 7 and the second semiconductor element 8 are suppressed. The second adhesive layer 9 also has a function as a spacer layer, and an insulating resin layer of which thickness is over 25 μm is applied for the second adhesive layer 9 to obtain this function.

If the thickness of the second adhesive layer 9 is 25 μm or less, there is a possibility that the first bonding wire 7 may be in contact with the semiconductor element 8, and the insulation failure and the short circuit may easy to occur. It is preferable that the thickness of the second adhesive layer 9 is to be 50 μm or more, further to be 70 μm or more, although it depends on a diameter of the first bonding wire 7. As a concrete example when the diameter of the first bonding wire 7 is 25 μm, the adhesive layer 9 of which thickness is 75 μm or 85 μm can be cited. It is preferable that the thickness of the second adhesive layer 9 is to be 150 μm or less because the stacked-type semiconductor device 1 is interrupted to be thin if the thickness of the second adhesive layer 9 is too thick.

It is preferable that viscosity at the adhesive temperature (adhesive viscosity) of the second adhesive layer 9 is to be 1 kPa·s or more and less than 100 kPa·s to take in a part of the first bonding wire 7 well at the time of adhering. When the adhesive viscosity of the second adhesive layer 9 is less than 1 kPa·s, there is a possibility that the adhesive may run off from an element end portion because it is too soft. When the adhesive viscosity of the second adhesive layer 9 is 100 kPa·s or more, there is a possibility that a deformation or connection failure may occur in the first bonding wire 7. It is more preferable that the adhesive viscosity of the second adhesive layer 9 is in a range of 1 to 50 kPa·s, and further, it is desirable to be in the range of 1 to 20 kPa·s.

Figure 2:
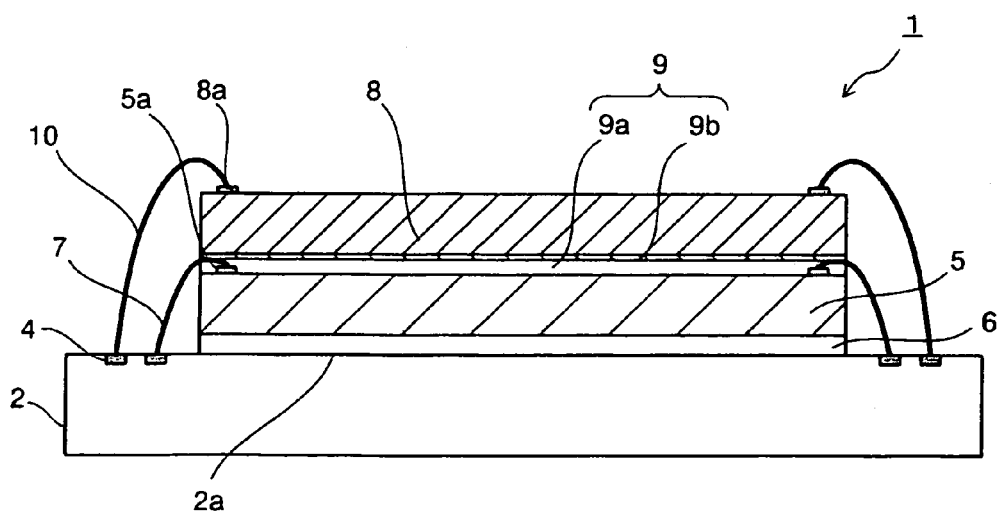
FIG. 2 is a sectional view showing a modified example of the semiconductor device shown in FIG. 1.

In FIG. 1, the contact between the first bonding wire 7 and the second semiconductor element 8 is suppressed based on the thickness of the second adhesive layer 9. The second adhesive layer 9 in which a first resin layer 9a softening or melting at the adhesive temperature of the second semiconductor element 8 and a second resin layer 9b maintaining a layer state at the adhesive temperature of the second semiconductor element 8 are stacked may be applied as shown in FIG. 2. Both the first and second resin layers 9a, 9b are composed of insulating resins. The first resin layer 9a is formed at the first semiconductor element 5 side, and functions as an adhesive layer of the second semiconductor element 8. The second resin layer 9b is formed at the second semiconductor element 8 side, and functions as an insulating layer preventing the contact between the first bonding wire 7 and the second semiconductor element 8.

The element side end portion of the first bonding wire 7 is embedded inside of the first resin layer (adhesive layer) 9a. The second resin layer (insulating layer) 9b maintaining the layer state for the adhesive temperature of the second semiconductor element 8 is formed at the second semiconductor element 8 side, and thereby, it becomes possible to prevent the occurrences of the insulation failure and the short circuit caused by the contact of the first bonding wire 7 and the second semiconductor element 8 more certainly. The adhesive between the first semiconductor element 5 and the second semiconductor element 8 in itself is realized well by the first resin layer 9a. The adhesive layer 9 of a two-layer structure is formed by, for example, stacking resin sheets having different adhesive viscosity, or sequentially coating insulating resin compositions.

In the adhesive layer 9 having the two-layer structure, it is preferable that the adhesive viscosity of the second resin layer (insulating layer) 9b is to be 100 kPa·s or more. When the adhesive viscosity of the second resin layer 9b is less than 100 kPa·s, the contact prevention function of the first bonding wire 7 cannot be fully brought out. It is more preferable that the adhesive viscosity of the second resin layer 9b is 200 kPa·s or more. When the viscosity is too high, the function as the adhesive layer may be lost, and therefore, it is preferable that the adhesive viscosity of the second resin layer 9b is to be less than 1000 kPa·s. The adhesive viscosity of the first resin layer (adhesive layer) 9a is preferable to be 1 kPa·s or more and less than 100 kPa·s.

The second adhesive layer 9 is formed by bonding an adhesive sheet or coating the adhesive resin composition on a rear surface of the semiconductor wafer beforehand, and thereafter, it is cut together with the semiconductor wafer. When the adhesive layer 9 of the two-layer structure is applied, for example, an insulating resin sheet maintaining the layer state at the adhesive temperature (second resin sheet of which adhesive viscosity is 100 kPa·s or more) and an adhesive resin sheet (first resin sheet of which adhesive viscosity is 1 kPa·s or more and less than 100 kPa·s) are stacked, and this is bonded at the rear surface of the semiconductor wafer. An adhesive sheet and the adhesive layer 9 of the two-layer structure of the first resin layer (adhesive layer) 9a and the second resin layer (insulating layer) 9b can be obtained by coating the same insulating resin compositions by differing dry temperature and dry time at the time when the layer is formed.

It is preferable that room temperature modulus of elasticity before curing of the second adhesive layer 9 is in a range of 100 to 3000 MPa in order to cut the second adhesive layer 9 (including the insulating layer 9b when it is in the two-layer structure) together with the semiconductor wafer. It becomes possible to suppress the chipping of the semiconductor wafer in a later-described cutting process with a good repeatability by applying the second adhesive layer 9 as stated above. The modulus of elasticity at the time of cutting of the second adhesive layer 9 may be adjusted to be in the range of 100 to 3000 MPa by cooling the second adhesive layer 9. In any case, the modulus of elasticity of the second adhesive layer 9 at the time of cutting is made to be in the range of 100 to 3000 MPa, and thereby, it becomes possible to suppress the chipping of the semiconductor wafer.

A thermosetting resin such as, for example, an epoxy resin is used for the insulating resin composing the second adhesive layer 9. The adhesive viscosity and the room temperature modulus of elasticity before curing of the thermosetting resin can be adjusted by a composition of the thermosetting resin (resin composition and additive composition by a filler and so on) and heat temperature in the adhesive process. When the adhesive layer 9 of the two-layer structure is applied, the insulating layer 9b may be composed of either insulating resin which is the same kind or the different kind with/from the adhesive layer 9a. As the composing material of the insulating layer 9b, the thermosetting resin such as an epoxy resin, a polyimide resin, a silicon resin, an acrylic resin, and so on can be cited, and the insulating resin of which viscosity at the adhesive temperature is higher than the adhesive layer 9a is used.

The second semiconductor element 8 adhered on the first semiconductor element 5 via the second adhesive layer 9 has second electrode pads (electrode part) 8a. The second electrode pads 8a are electrically connected to the connection pads 4 of the wiring substrate 2 via second bonding wires 10. The first and second semiconductor elements 5, 8 stacked on the wiring substrate 2 are sealed with a sealing resin 11 such as, for example, the epoxy resin. The stacked-type semiconductor device 1 of the stacked multi-chip package structure is constituted by these respective components.

In FIG. 1 and FIG. 2, the structure in which two semiconductor elements 5, 8 are stacked is described, but the number of stacked layers of the semiconductor elements is not limited. The stacked number of the semiconductor elements may be three layers or more. Further, the mode of the stacked-type semiconductor device is not limited to the stacked multi-chip package as stated above, and it may be a semiconductor package (TSOP, and so on) using a lead frame as the circuit board for mounting element.

The stacked-type semiconductor device 1 of this embodiment is prepared as follows. At first, the first semiconductor element 5 is adhered on the wiring substrate 2 by using the first adhesive layer 6. Subsequently, a wire bonding process is performed to electrically connect the connection pads 4 of the wiring substrate 2 and the electrode pads 5a of the first semiconductor element 5 by the first bonding wires 7. The second semiconductor element 8 is adhered on the first semiconductor element 5 by using the second adhesive layer 9. A forming process and an adhering process of the second semiconductor element 8 according to the first embodiment are described in detail with reference to FIG. 3A to FIG. 3C.

Figure 3A:
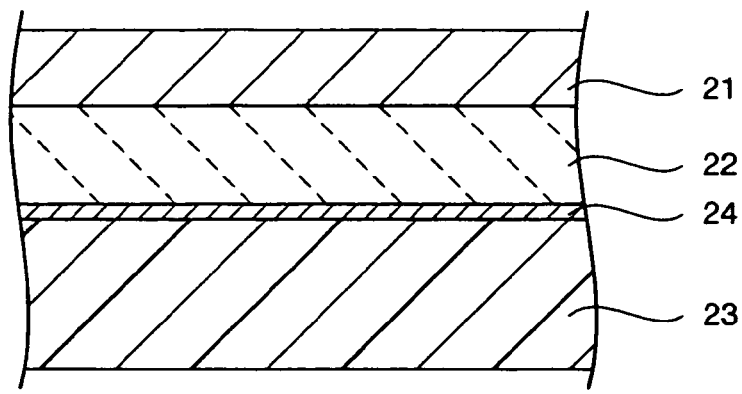
FIG. 3A, FIG. 3B, and FIG. 3C are sectional views showing a manufacturing process of a semiconductor device according to a first embodiment.

The second adhesive layer 9 is formed on the rear surface of the second semiconductor element 8 in order to perform the adhering process of the second semiconductor element 8. The second adhesive layer 9 is formed in advance on the rear surface of the semiconductor wafer before being divided into the second semiconductor element 8, as a bonding layer of an adhesive sheet and a coating layer of an adhesive resin composition. As shown in FIG. 3A, an adhesive layer 22 to be the second adhesive layer 9 is formed by bonding the adhesive sheet or coating the adhesive resin composition on a rear surface of a semiconductor wafer 21 having plural element regions corresponding to the second semiconductor elements 8. Further, the adhesive layer 22 is bonded to a dicing tape 23 in this state.

As stated above, the adhesive layer 22 and the dicing tape 23 are sequentially laminated on the rear surface of the semiconductor wafer 21. A viscous layer 24 composed of, for example, an UV curable resin layer of which thickness is approximately 1 μm to 30 μm is used to adhere the dicing tape 23 and the adhesive layer 22. The viscous layer 24 composed of the UV curable resin layer may be cured in advance before a cutting (blade dicing) process, but it is not necessarily limited to the above. The viscous layer 24 in itself can be omitted depending on a combination of the adhesive layer 22 and the dicing tape 23.

Next, the semiconductor wafer 21 is cut in accordance with the respective element regions together with the adhesive layer 22, to prepare the second semiconductor element 8 having a sectioned second adhesive layer 9. A blade dicing device of a biaxial structure is used to cut the semiconductor wafer 21. The blade dicing device of the biaxial structure is constituted such that two blades respectively attached to two rotating axes advance on the same trace. A diamond blade and so on of which cutting depth reaches a part of the adhesive layer 22 is used for a preceding first axis blade. A diamond blade and so on of which cutting depth reaches a part of the dicing tape 23 is used for a following second axis blade.

Figure 3B:
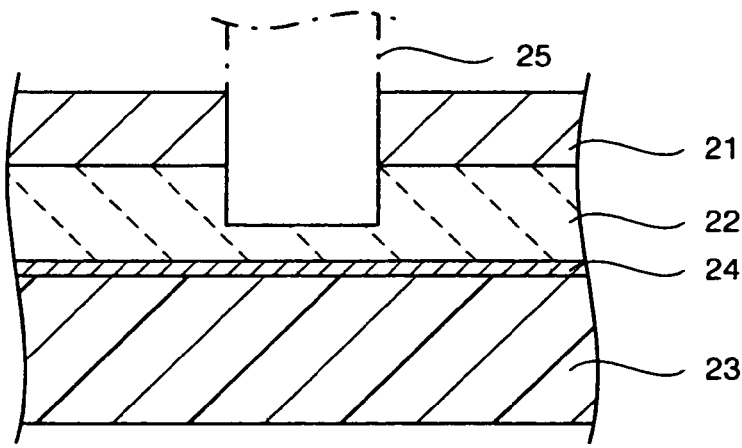

As shown in FIG. 3B, the semiconductor wafer 21 is cut together with a part of the adhesive layer 22 by a first axis blade 25. The first axis blade 25 is to cut the semiconductor wafer 21 to make it a separate piece, and to cut only a part of the adhesive layer 22. In a first cutting process by the first axis blade 25, the adhesive layer 22 is not completely cut, and a part thereof remains in an uncut state. A thickness of the uncut portion (remaining portion) of the adhesive layer by the first axis blade 25 is preferable to be 20 μm or less, although it depends on an original thickness and hardness (room temperature modulus of elasticity at the time of cutting) of the adhesive layer 22, the thickness and variation of the semiconductor wafer 21, and so on. The thickness of the uncut portion is more preferable to be in a range of 3 to 20 μm.

Figure 3C:
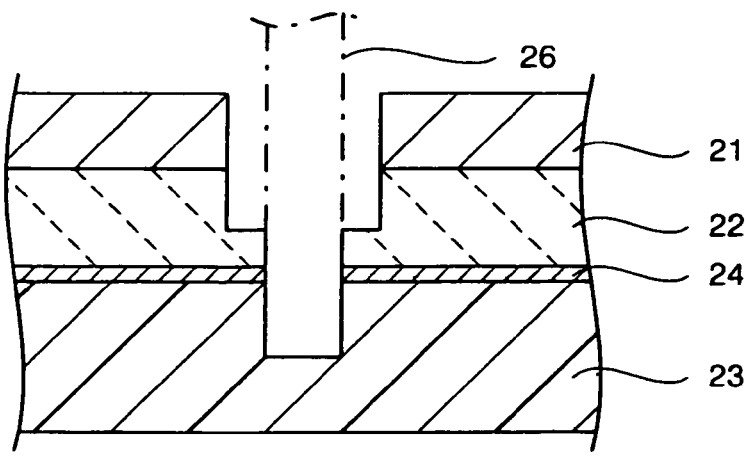

Next, as shown in FIG. 3C, the adhesive layer 22 is cut together with a part of the dicing tape 23 by a second axis blade 26. The blade 26 of which width (blade thickness) is narrower than the first axis blade 25 is attached to the second axis so that it is possible to trace inside of a cut trail of the first axis blade 25. The second axis blade 26 is to cut and make a separate piece of the adhesive layer 22, and to cut a part of the dicing tape 23. A part of the dicing tape 23 is cut in a second cutting process by the second axis blade 26, and thereby, the sectioned second semiconductor element 8 is maintained to be in a state held by the dicing tape 23. The second semiconductor element 8 held by the dicing tape 23 is transferred to a pick up process under this state.

The first axis blade 25 cuts until a part of the adhesive layer 22, the second axis blade 26 cuts the adhesive layer 22 together with a part of the dicing tape 23, and thereby, it becomes possible to divide and section the adhesive layer 22 sanely even in a case when the adhesive layer 22 of which thickness is over 25 μm is applied. Cutting failure such that the adhesive layers are connected caused by a deformation at the time of cutting, a mixture of cut scraps, and the cutting heat, are occurred in the conventional step cut. It is possible to suppress the occurrence of the cutting failure according to this embodiment. Consequently, it becomes possible to suppress the occurrences of the pick up failure and the element failure of the second semiconductor element 8 in the subsequent pick up process.

The cutting process in which the first process by the first axis blade 25 and the second process by the second axis blade 26 are combined, effectively functions when the adhesive layer 22 of which thickness is over 25 μm is applied. In particular, when the thickness of the adhesive layer 22 is over 50 μm, and further when it is over 70 μm, the cutting process of the first embodiment is effective because a welding failure and so on are easy to occur in the adhesive layer 22 in the conventional cutting process. It is possible to apply the cutting process of the first embodiment to the adhesive layer of which thickness is 25 μm or less, but it is possible to cut the adhesive layer without generating the welding failure and so on, by the conventional cutting process, and therefore, a necessity to cut up to a part of the adhesive layer 22 by the first axis blade 25 is low. When the adhesive layer 22 has the two-layer structure of the insulating layer 9a and the adhesive layer 9b, the thickness of the adhesive layer 22 represents a total thickness of the insulating layer 9a and the adhesive layer 9b.

In the first embodiment, the semiconductor wafer 21 is cut and sectioned by the first axis blade 25. If a thin semiconductor wafer 21 such that the thickness is 85 μm or less is cut only by the first axis blade 25, there is a possibility that the chipping is easy to occur at the time of cutting. It is effective to use the adhesive layer 22 of which room temperature modulus of elasticity before curing (modulus of elasticity at the time of cutting) is in the range of 100 to 3000 MPa for the problem as stated above. The modulus of elasticity at the time of cutting of the adhesive layer 22 may be controlled in the range of 100 to 3000 MPa by cooling at the time of cutting.

According to the adhesive layer 22 of which modulus of elasticity at the time of cutting is 100 MPa or more, the hardness of the adhesive layer 22 receives the first axis blade 25, and thereby, the occurrence of the chipping of the semiconductor wafer 21 can be suppressed, even when apart of the adhesive layer 22 is continuously cut from the semiconductor wafer 21 by the first axis blade 25. If the adhesive layer 22 is too hard, a cut efficiency of the first axis blade 25 may deteriorate, or a function as the adhesive may deteriorate. The modulus of elasticity at the time of cutting of the adhesive layer 22 is preferable to be 3000 MPa or less.

Figure 4:
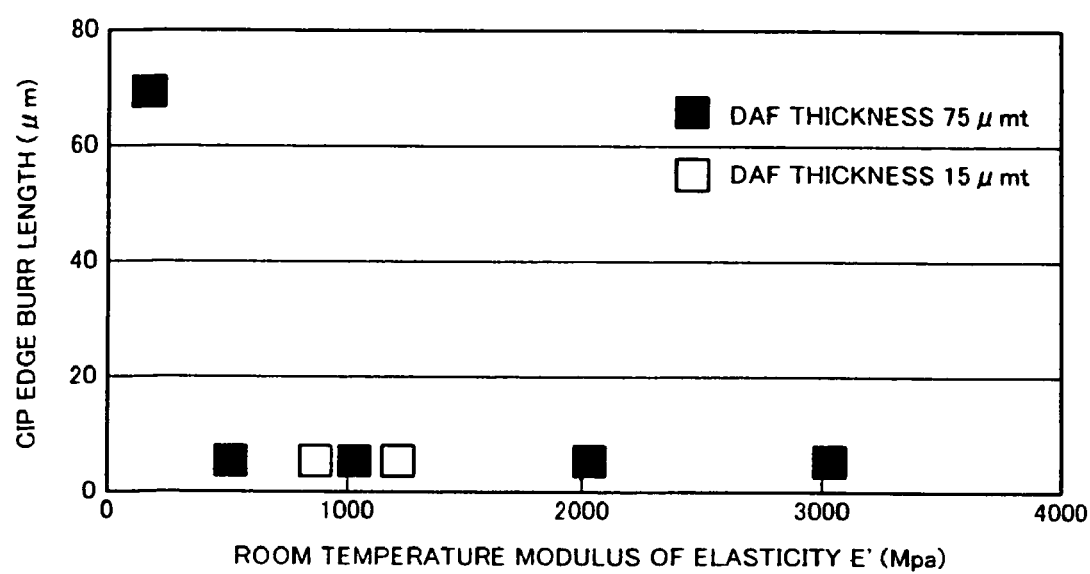
FIG. 4 is a view showing an example of a relation between room temperature modulus of elasticity before curing of an adhesive layer applied in the first embodiment and a burr length in a dicing process.

An example of a relation between the room temperature modulus of elasticity of the adhesive layer 22 and a burr length at the element end portion of the sectioned semiconductor element is shown in FIG. 4. As shown in FIG. 4, it becomes possible to suppress an occurrence of the chipping and the burr based on the chipping by controlling the modulus of elasticity at the time of cutting of the adhesive layer 22. When the modulus of elasticity of the adhesive layer 22 is over 3000 MPa, the function as the adhesive layer 22 deteriorates. It is more preferable that the room temperature modulus of elasticity of the adhesive layer 22 is in a range of 500 to 1200 MPa.

After that, the sectioned second semiconductor element (8) is picked up from the dicing tape 23 by using a suction collet and so on. The sectioned second adhesive layer 9 is formed at the rear surface of the second semiconductor element 8. The second adhesive layer 9 can surely be sectioned by the above-stated blade dicing device of biaxial structure, and therefore, it is possible to suppress the occurrences of the pick up failure and the element failure caused by the cut failure of the second adhesive layer 9. Namely, it is possible to stably pick up the second semiconductor element 8 in which the second adhesive layer 9 is formed at the rear surface thereof, and therefore, a yield and a reliability of the pick up process can be increased.

The second semiconductor element 8 picked up from the dicing tape 23 is adhered on the first semiconductor element 5 via the second adhesive layer 9 at the rear surface of the second semiconductor element 8. Here, a case in which the second semiconductor element 8 is adhered on the first semiconductor element 5 is mainly described. A semiconductor element sectioned in the cutting process may be adhered on a circuit board such as a wiring substrate or a lead frame. The cutting process according to the first embodiment is applied to a semiconductor wafer applying the adhesive layer of which thickness is over 25 μm. The semiconductor element after cutting can be adhered on a constructing base of the semiconductor device (device constructing base) composed of another semiconductor element, circuit board, and so on by using the adhesive layer at the rear surface of the semiconductor element.

An adhering process of the second semiconductor element 8 is performed as stated below. The wiring substrate 2 on which the first semiconductor element 5 is adhered is placed on a die bonding stage. The second semiconductor element 8 in which the second adhesive layer 9 is formed at the rear surface is held by a die bonding tool such as the suction collet. The second semiconductor element 8 held by the die bonding tool is lowered after being positioned relative to the first semiconductor element 5, and the second adhesive layer 9 is pressed to the first semiconductor element 5. At this time, the second adhesive layer 9 is heated by using at least one of the die bonding stage and/or the die bonding tool.

The second adhesive layer 9 has the thickness capable of embedding the element side end portion of the first bonding wire 7 inside thereof, and has a function to keep an interval between the first and second semiconductor elements 5, 8 based on the adhesive viscosity (1 kPa·s or more and less than 100 kPa·s). Accordingly, a contact between the first bonding wire 7 and the second semiconductor element 8 is suppressed. The second adhesive layer 9 is further heated to be thermally set under the state as described above, and thereby, it becomes possible to stack the second semiconductor element 8 which is the same or a larger shape compared to the first semiconductor element 5 on the first semiconductor element 5 while suppressing the contact between the first bonding wire 7 and the second semiconductor element 8.

When the insulating layer 9b is provided at a lower surface of the second semiconductor element 8, the first bonding wire 7 may be positively brought into contact with the insulating layer 9b, and thereby, the first bonding wire 7 may be deformed toward the wiring substrate 2. Accordingly, the semiconductor device 1 of the stacked multi-chip package structure in which a further more thinner and an improvement in reliability are made compatible can be realized. A distance between the first semiconductor element 5 and the second semiconductor element 8 may be maintained by forming a stud bump composed of a metallic material, a resin material, or the like on an electrode pad which is not used for the connection of the first semiconductor element 5 (non-connection pad).

After that, a wire bonding process is performed for the second semiconductor element 8, and the connection pads 4 of the wiring substrate 2 and the electrode pads 8a of the second semiconductor element 8 are electrically connected by second bonding wires 10. Further, the first and second semiconductor elements 5, 8 are packaged by the sealing resin 11 together with the first and second bonding wires 7, 10, and so on, and thereby, the stacked-type semiconductor device 1 shown in FIG. 1 and FIG. 2 is prepared. It becomes possible to manufacture the stacked-type semiconductor device 1 efficiently and with high yield, because a cut yield and a pick up success rate of the second semiconductor element 8 can be increased in the manufacturing method of the first embodiment.

Measured results of the pick up success rate and a chipping amount (maximum chipping length) when a cut condition of a semiconductor wafer is changed, are shown in table 1. In each example shown in Table 1, an adhesive layer with a thickness of 85 μm and a dicing tape (DC tape) with a thickness of 100 μm are adhered on a rear surface of a semiconductor wafer with a thickness of 60 μm, and these are cut by using a blade dicing device of a biaxial structure. An UV curable viscous layer with a thickness of 10 μm is used to adhere the adhesive layer and the dicing tape. A diamond blade with a particle size of #4000, and a blade thickness of 30 μm is used for a first axis blade. A diamond blade with a particle size of #3500, and a blade thickness of 25 μm is used for a second axis blade.

In Example 1, an adhesive with room temperature modulus of elasticity of 1000 MPa is used. The adhesive is cut by the first axis blade to have remaining thickness of 10 μm, and this is cut by the second axis blade to be a separate piece. In Example 2, the remaining thickness of the adhesive layer by the first axis blade is set to be 65 μm. In Example 3, an adhesive with the room temperature modulus of elasticity of 100 MPa is used. This adhesive is cut under the same condition with Example 1 except a point that the adhesive is cooled so that the modulus of elasticity at the time of cutting is to be 500 MPa. Example 4 is made to be the same condition with Example 3 except a point that the adhesive is not cooled at the time of cutting. In Comparative Example 1, a cutting depth of the first axis blade is set to be within the thickness of the semiconductor wafer, and this is cut to be a separate piece by the second axis blade together with the adhesive layer. In Comparative Example 2, the cutting is performed only by the first axis blade.

TABLE 1

| | Room Temperature Modulus of Elasticity (MPa) | First Axis Blade | | Second Axis Blade | | Pick up success Rate (%) | Chipping Amount (μm) |
|---|---|---|---|---|---|---|---|
| | | Blade Thickness (μm) | Cutting Depth (Remaining Thickness) | Blade Thickness (μm) | Cutting Range | | |
| E1 | 1000 | 30 | Within adhesive layer(10 μm) | 25 | Adhesive layer→ DC tape | 100 | 11 |
| E2 | 1000 | 30 | Within adhesive layer(65 μm) | 25 | Adhesive layer→ DC tape | 98 | 16 |
| E3 | 100 (cooled cutting: at the time of cutting 500) | 30 | Within adhesive layer(10 μm) | 25 | Adhesive layer→ DC tape | 100 | 14 |
| E4 | 100 (without cooling) | 30 | Within adhesive layer(10 μm) | 25 | Adhesive layer→ DC tape | 100 | 25 |
| CE1 | 1000 | 30 | Within wafer(10 μm) | 25 | Wafer→ DC tape | 60 | 13 |
| CE2 | 1000 | 30 | DC tape | — | — | 79 | 71 |

E1 = Example 1;
E2 = Example 2;
E3 = Example 3;
E4 = Example 4;
CE1 = Comparative Example 1,
CE2 = Comparative Example 2

As it is obvious from Table 1, the pick up success rates in the respective cutting processes of Examples 1 to 4 are improved compared to Comparative Examples 1 and 2. It is preferable that the remaining thickness of the adhesive layer is set to be 20 μm or less because the pick up success rate tends to deteriorate slightly when the remaining thickness of the adhesive layer by the first axis blade is too thick. It is preferable that the remaining thickness of the adhesive layer is set to be 3 μm or more because a stability of the cutting process may deteriorate if a setting value of the remaining thickness of the adhesive layer is too small. It is preferable that the room temperature modulus of elasticity of the adhesive layer is set to be in the range of 100 MPa to 3000 MPa because the chipping amount tends to increase when the room temperature modulus of elasticity of the adhesive layer is too low. It is possible to obtain the similar effect by controlling the modulus of elasticity of the adhesive layer by cooling at the time of cutting.

Next, a manufacturing process of a semiconductor device according to a second embodiment is described with reference to FIG. 5A to FIG. 5C. The manufacturing method of the semiconductor device according to the second embodiment is applied to the forming process and the adhering process of the second semiconductor element 8 in the manufacturing process of the stacked-type semiconductor device 1 shown in FIG. 1 and FIG. 2 as same as in the first embodiment. The manufacturing method of the second embodiment is not limited to the above, and it is possible to apply to manufacturing processes of various semiconductor devices having a process cutting an adhesive layer of which thickness is over 25 μm together with a semiconductor wafer, and a process adhering a semiconductor element sectioned in the cutting process on a device constructing base such as another semiconductor element and a circuit board.

In the manufacturing process according to the second embodiment, the adhering process of the first semiconductor element 5 and the wire bonding process are performed as same as in the first embodiment. It is also the same as for the process in which the adhesive layer 22 and the dicing tape 23 are sequentially stacked at the rear surface of the semiconductor wafer 21. As shown in the first embodiment, the adhesive layer 22 is formed by bonding the adhesive sheet and coating the adhesive resin composition on the rear surface of the semiconductor wafer 21 having plural element regions corresponding to the second semiconductor elements 8. Further, the semiconductor wafer 21 is bonded to the dicing tape 23 under this state.

Next, the semiconductor wafer 21 is cut together with the adhesive layer 22 in accordance with the respective element regions, to prepare the second semiconductor element 8 having the sectioned second adhesive layer 9. Here, a blade dicing device of a triaxial structure is used to cut the semiconductor wafer 21. A diamond blade and so on of which cutting depth is within the thickness of the semiconductor wafer 21 is used for a preceding first axis blade. A diamond blade and so on of which cutting depth reaches a part of the adhesive layer 22 is used for an intermediate second axis blade. A diamond blade and so on of which cutting depth reaches a part of the dicing tape 23 is used for a following third axis blade.

Figure 5A:
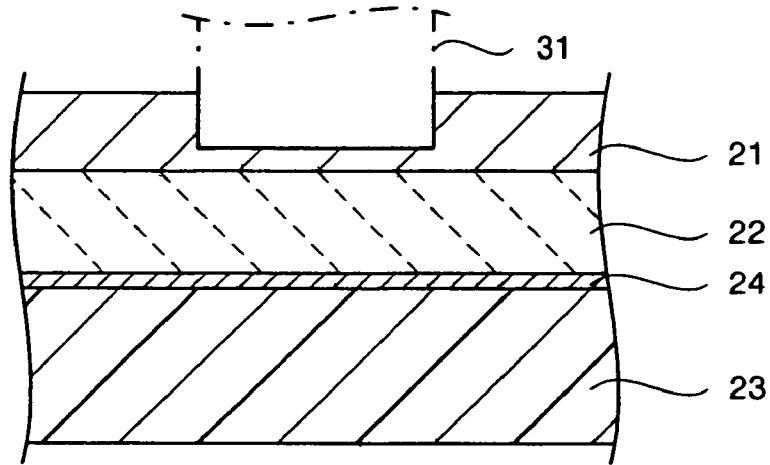
FIG. 5A, FIG. 5B, and FIG. 5C are sectional views showing a manufacturing process of a semiconductor device according to a second embodiment.

In the cutting process of the second embodiment, at first, a part of the semiconductor wafer 21 is cut by a first axis blade 31 as shown in FIG. 5A. The first axis blade 31 is to cut only a part of the semiconductor wafer 21. In a first cutting process by the first axis blade 31, the semiconductor wafer 21 is not completely cut, and a part thereof remains in an uncut state. It is preferable that a thickness of the uncut portion (remaining portion) of the semiconductor wafer 21 in the first cutting process is set to be 10 μm or less, although it depends on an original thickness and so on of the semiconductor wafer 21. The thickness of the uncut portion is more preferable in the range of 1 to 10 μm.

Figure 5B:
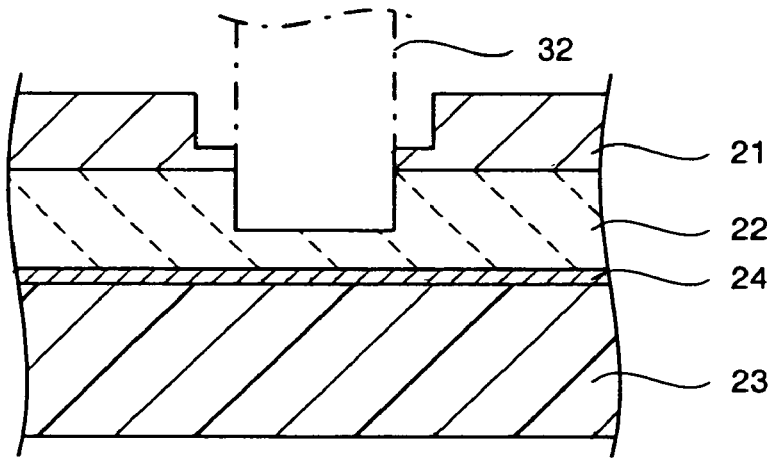

Next, as shown in FIG. 5B, the semiconductor wafer 21 is cut by a second axis blade 32 together with a part of the adhesive layer 22. The blade 32 of which width (blade thickness) is narrower than that of the first axis blade 31 is attached to the second axis so that it is possible to trace inside of a cut trail of the first blade 31. The second axis blade 32 is to cut the semiconductor wafer 21 to make it a separate piece, and to cut only a part of the adhesive layer 22. The adhesive layer 22 is not completely cut, but a part thereof remains in an uncut state in a second cutting process by the second axis blade 32. It is preferable that a thickness of the uncut portion (remaining portion) of the adhesive layer 22 in the second cutting process is set to be 20 μm or less, although it depends on an original thickness and room temperature modulus of elasticity and soon at the time of cutting of the adhesive layer 22. The thickness of the uncut portion is more preferable in the range of 3 to 20 μm.

Figure 5C:
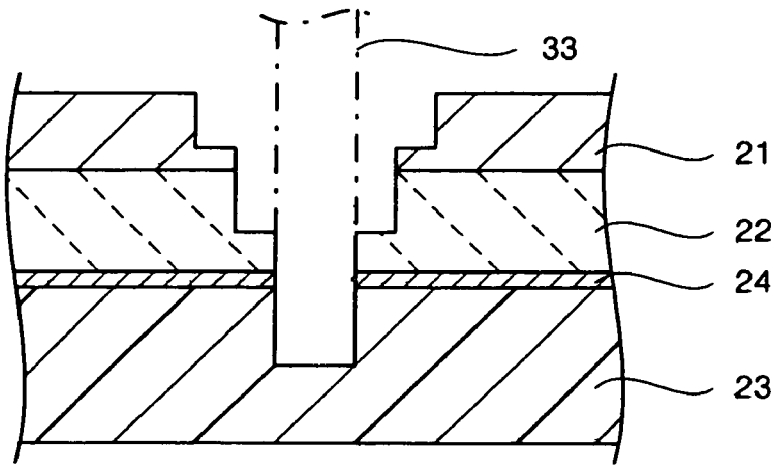

As shown in FIG. 5C, the adhesive layer 22 is cut together with a part of the dicing tape 23 by a third axis blade 33. The blade 33 of which width (blade thickness) is narrower than that of the second axis blade 32 is attached to the third axis so that it is possible to trace inside of cut trails of the first and second blades 31, 32. The third axis blade 33 is to cut the adhesive layer 22 to make it a separate piece, and to cut a part of the dicing tape 23. Only a part of the dicing tape 23 is cut in a third cutting process, and thereby, the sectioned second semiconductor element 8 is maintained to be in a state held by the dicing tape 23, and transferred to the pick up process under this state.

As stated above, the first axis blade 31 cuts only a part of the semiconductor wafer 21, the second axis blade 32 cuts up to a part of the adhesive layer 22 while cutting the semiconductor wafer 21, and the third axis blade 33 cuts up to a part of the dicing tape 23 while cutting the adhesive layer 22. Accordingly, it becomes possible to surely make a separate piece of the adhesive layer 22 even when, for example, the adhesive layer 22 of which thickness is over 25 μm is applied. Further, it is possible to suppress the chipping of the semiconductor wafer 21. Consequently, it becomes possible to suppress occurrences of the pick up failure and the element failure while suppressing the occurrence of the cut failure of the adhesive layer 22.

The cutting process using the blade dicing device of the triaxial structure functions effectively when the adhesive layer 22 of which thickness is over 25 μm is applied. In particular, when the thickness of the adhesive layer 22 is over 50 μm, further when it is over 70 μm, the cutting process of the second embodiment is effective because welding failure and so on are easy to occur in the adhesive layer 22 by the conventional cutting process. The room temperature modulus of elasticity (modulus of elasticity at the time of cutting) of the adhesive layer 22 is effective to be controlled as same as in the first embodiment, but it is not necessarily limited to the above. The semiconductor wafer 21 is sequentially cut by the first axis blade 31 and the second axis blade 32, and thereby, the occurrence of the chipping can be suppressed. Consequently, the adhesive layer 22 of which room temperature modulus of elasticity before curing is less than 100 MPa may be applied.

After that, the pick up process of the second semiconductor element 8, the adhering process to the first semiconductor element 5, the wire bonding process to the second semiconductor element 8, and the sealing process by the sealing resin 11 are performed as same as in the first embodiment, and thereby, the stacked-type semiconductor device 1 shown in FIG. 1 and FIG. 2 is prepared. The adhering process of the second semiconductor element 8 is performed while taking a part of the bonding wire 7 inside of the second adhesive layer 9 as same as in the first embodiment. The second adhesive layer 9 may be the two-layer structure having of the insulating layer 9a and the adhesive layer 9b.

It is possible to increase the cut yield or the pick up success rate of the second semiconductor element 8 also by the manufacturing method of the second embodiment. It becomes possible to prepare the stacked-type semiconductor device 1 effectively and with high yield. Further, the chipping of the semiconductor element is suppressed by the first axis blade, and therefore, restrictions for the adhesive layer can be decreased. However, cutting efficiency and cutting accuracy of the blade dicing device of the biaxial structure are higher, and therefore, the first embodiment has an advantage over the second embodiment from this point.

The present invention is not limited to the respective embodiments as stated above, but can be applied to a manufacturing process of various stacked-type semiconductor devices in which plural semiconductor elements are stacked and mounted on a circuit board, and a manufacturing process of a semiconductor device having a process in which the semiconductor element is adhered on a device constructing base such as another semiconductor element, a circuit board, and so on, by using an adhesive layer of which thickness is over 25 µm. The manufacturing methods of the semiconductor device as stated above are also included in the present invention. Besides, the embodiments of the present invention can be expanded or modified without departing from the range of the following claims of the present invention, and all the changes and modifications are to be included therein.

What is claimed is:

1. A manufacturing method of a semiconductor device, comprising:
   sequentially laminating an adhesive layer of which thickness is over 25 µm and a dicing tape on a rear surface of a semiconductor wafer having plural element regions, wherein the adhesive layer has a room temperature modulus of elasticity before curing in a range of not less than 100 MPa nor more than 3000 MPa;
   cutting a part of the semiconductor wafer in accordance with the plural element regions by using a first blade of which cutting depth is within the semiconductor wafer and does not reach the adhesive layer;
   cutting the semiconductor wafer together with a part of the adhesive layer having the room temperature modulus of elasticity in a range of not less than 100 MPa nor more than 3000 MPa by using a second blade of which cutting depth reaches the adhesive layer and does not reach the dicing tape, and having a narrower width than the first blade;
   cutting the adhesive layer having the room temperature modulus of elasticity in a range of not less than 100 MPa nor more than 3000 MPa together with a part of the dicing tape by using a third blade of which cutting depth reaches the dicing tape and having a narrower width than the second blade;
   picking up a semiconductor element sectioned by cutting the semiconductor wafer with the adhesive layer, from the dicing tape; and
   adhering the picked up semiconductor element on a device constructing base via the adhesive layer laminated on a rear surface of the semiconductor element.

2. The manufacturing method of the semiconductor device according to claim 1,
   wherein a thickness of the adhesive layer is in a range of not less than 50 µm nor more than 150 µm.

3. The manufacturing method of the semiconductor device according to claim 1,
   wherein a thickness of an uncut portion of the semiconductor wafer by the first blade is in a range of 10 µm or less.

4. The manufacturing method of the semiconductor device according to claim 1,
   wherein a thickness of an uncut portion of the adhesive layer by the second blade is in a range of 20 µm or less.

5. The manufacturing method of the semiconductor device according to claim 1,
   wherein the device constructing base is composed of a circuit board or another semiconductor element.

6. The manufacturing method of the semiconductor device according to claim 1, further comprising:
   adhering a first semiconductor element as the device constructing base on a circuit board;
   electrically connecting a connection part of the circuit board and an electrode part of the first semiconductor element via a first bonding wire; and
   adhering the semiconductor element as a second semiconductor element on the first semiconductor element via the adhesive layer.

7. The manufacturing method of the semiconductor device according to claim 6,
   wherein an end portion connected to the first semiconductor element of the first bonding wire is embedded into the adhesive layer.

8. The manufacturing method of the semiconductor device according to claim 7,
   wherein the adhesive layer includes an insulating resin layer softening or melting at adhesive temperature of the second semiconductor element, and the first bonding wire is apart from a lower surface of the second semiconductor element based on a thickness of the adhesive layer.

9. The manufacturing method of the semiconductor device according to claim 7,
   wherein the adhesive layer includes a first insulating resin layer disposed at the first semiconductor element side and softening or melting at the adhesive temperature of the second semiconductor element, and a second insulating resin layer disposed at the second semiconductor element side and maintaining a layer state for the adhesive temperature of the second semiconductor element, and the end portion of the first bonding wire is embedded into the first insulating resin layer.

10. A semiconductor device manufactured by the manufacturing method according to claim 1.

11. A semiconductor device manufactured by the manufacturing method according to claim 6.

* * * * *